(12) United States Patent
Hiratsuka et al.

(10) Patent No.: US 10,086,478 B2
(45) Date of Patent: Oct. 2, 2018

(54) METALLIC PARTICLE PASTE, CURED PRODUCT USING SAME, AND SEMICONDUCTOR DEVICE

(71) Applicant: KABUSHIKI KAISHA TOSHIBA, Minato-ku (JP)

(72) Inventors: Daisuke Hiratsuka, Yokohama (JP); Tomohiro Iguchi, Kawasaki (JP); Masayuki Uchida, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 439 days.

(21) Appl. No.: 14/337,624

(22) Filed: Jul. 22, 2014

(65) Prior Publication Data

US 2015/0069638 A1   Mar. 12, 2015

(30) Foreign Application Priority Data

Sep. 10, 2013   (JP) .................................. 2013-187709

(51) Int. Cl.
  *B23K 35/02*   (2006.01)
  *B23K 35/24*   (2006.01)
  (Continued)

(52) U.S. Cl.
  CPC .......... *B23K 35/025* (2013.01); *B22F 1/0003* (2013.01); *B22F 1/0018* (2013.01); *B22F 1/0074* (2013.01); *B23K 35/24* (2013.01); *B23K 35/262* (2013.01); *B23K 35/264* (2013.01); *B23K 35/282* (2013.01); *B23K 35/286* (2013.01); *B23K 35/30* (2013.01); *B23K 35/302* (2013.01); *B23K 35/3006* (2013.01); *B23K 35/3013* (2013.01); *B23K 35/3033* (2013.01); *B23K 35/32* (2013.01); *B23K 35/322* (2013.01); *B23K 35/325* (2013.01); *B23K 35/3601* (2013.01); *B23K 35/362* (2013.01); *C22C 1/0491* (2013.01); *C22C 5/06* (2013.01); *H01L 21/4867* (2013.01); *H01L 23/3737* (2013.01); *H01L 24/27* (2013.01); *H01L 24/29* (2013.01);
  (Continued)

(58) Field of Classification Search
  CPC ........................... B23K 35/025; B22F 1/0003
  USPC ......................................................... 148/24
  See application file for complete search history.

(56) References Cited

U.S. PATENT DOCUMENTS

5,882,722 A      3/1999 Kydd
2002/0100986 A1  8/2002 Soga et al.
(Continued)

FOREIGN PATENT DOCUMENTS

CN       102810543 A      12/2012
DE   10 2004 019 567 B3   1/2006
(Continued)

OTHER PUBLICATIONS

Partial European Search Report dated Aug. 28, 2015 in Patent Application No. 14178910.7.
(Continued)

*Primary Examiner* — Weiping Zhu
(74) *Attorney, Agent, or Firm* — Oblon, McClelland, Maier & Neustadt, L.L.P.

(57) ABSTRACT

According to one embodiment, a metallic particle paste includes a polar solvent and particles dispersed in the polar solvent and containing a first metal. A second metal different from the first metal is dissolved in the polar solvent.

13 Claims, 5 Drawing Sheets

(51) Int. Cl.
| | |
|---|---|
| *B23K 35/362* | (2006.01) |
| *H01L 23/00* | (2006.01) |
| *B22F 1/00* | (2006.01) |
| *B23K 35/26* | (2006.01) |
| *B23K 35/28* | (2006.01) |
| *B23K 35/30* | (2006.01) |
| *B23K 35/32* | (2006.01) |
| *B23K 35/36* | (2006.01) |
| *C22C 1/04* | (2006.01) |
| *H01L 21/48* | (2006.01) |
| *H01L 23/373* | (2006.01) |
| *C22C 5/06* | (2006.01) |

(52) U.S. Cl.
CPC .............. *H01L 24/32* (2013.01); *H01L 24/83* (2013.01); *B22F 2999/00* (2013.01); *H01L 24/05* (2013.01); *H01L 2224/0381* (2013.01); *H01L 2224/04026* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05669* (2013.01); *H01L 2224/271* (2013.01); *H01L 2224/27003* (2013.01); *H01L 2224/2732* (2013.01); *H01L 2224/2741* (2013.01); *H01L 2224/2744* (2013.01); *H01L 2224/29006* (2013.01); *H01L 2224/2936* (2013.01); *H01L 2224/2938* (2013.01); *H01L 2224/2949* (2013.01); *H01L 2224/29294* (2013.01); *H01L 2224/29313* (2013.01); *H01L 2224/29318* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29369* (2013.01); *H01L 2224/29371* (2013.01); *H01L 2224/29372* (2013.01); *H01L 2224/29373* (2013.01); *H01L 2224/29376* (2013.01); *H01L 2224/29378* (2013.01); *H01L 2224/325* (2013.01); *H01L 2224/32225* (2013.01); *H01L 2224/32245* (2013.01); *H01L 2224/32503* (2013.01); *H01L 2224/32507* (2013.01); *H01L 2224/832* (2013.01); *H01L 2224/8322* (2013.01); *H01L 2224/83075* (2013.01); *H01L 2224/8384* (2013.01); *H01L 2224/83192* (2013.01); *H01L 2224/83203* (2013.01); *H01L 2224/83205* (2013.01); *H01L 2224/83411* (2013.01); *H01L 2224/83439* (2013.01); *H01L 2224/83444* (2013.01); *H01L 2224/83447* (2013.01); *H01L 2224/83455* (2013.01); *H01L 2224/83464* (2013.01); *H01L 2224/83469* (2013.01); *H01L 2924/01102* (2013.01); *H01L 2924/1033* (2013.01); *H01L 2924/1067* (2013.01); *H01L 2924/10253* (2013.01); *H01L 2924/10254* (2013.01); *H01L 2924/10272* (2013.01); *H01L 2924/12044* (2013.01); *H01L 2924/15787* (2013.01)

(56) References Cited

U.S. PATENT DOCUMENTS

| | | |
|---|---|---|
| 2012/0152510 A1 | 6/2012 | Noda et al. |
| 2012/0305920 A1 | 12/2012 | Nagasawa et al. |
| 2013/0277096 A1 | 10/2013 | Seong et al. |

FOREIGN PATENT DOCUMENTS

| | | | |
|---|---|---|---|
| DE | 10 2009 018 541 A1 | 10/2010 | |
| DE | 10 2011 109 226 A1 | 2/2011 | |
| DE | 102011109226 A1 * | 2/2013 | ............ H01L 24/29 |
| EP | 2 114 114 | 11/2009 | |
| EP | 2 147 739 A2 | 1/2010 | |
| EP | 2 560 197 A1 | 2/2013 | |
| JP | 2007-207577 A | 8/2007 | |
| JP | 2008-69374 A | 3/2008 | |
| JP | 2008-135190 | 6/2008 | |
| JP | 2008-235846 | 10/2008 | |
| JP | 2009-62570 | 3/2009 | |
| JP | 2009-97074 | 5/2009 | |
| JP | 2009-295965 A | 12/2009 | |
| JP | 2011-34749 A | 2/2011 | |
| JP | 2011-58041 | 3/2011 | |
| JP | 2011-240406 | 12/2011 | |
| JP | 2012-46779 | 3/2012 | |
| JP | 2012-124497 | 6/2012 | |
| JP | 2012-169374 | 9/2012 | |
| WO | WO 03/035279 A1 | 5/2003 | |
| WO | WO 2006/011180 A1 | 2/2006 | |
| WO | WO 2006/070747 A1 | 7/2006 | |
| WO | WO 2010/114874 A2 | 10/2010 | |
| WO | WO 2011/114751 A1 | 9/2011 | |
| WO | WO 201/026791 | 3/2012 | |

OTHER PUBLICATIONS

"Electrical resistivity and conductivity", Wikipedia, Internet Citation, Oct. 12, 2011, XP-007919566, Retrieved from the Internet: URL:https://en.wikipedia.org/w/index.php?title=Electrical_resistivity_ and_conductivity&oldid=455199279, 8 pages.

"List of thermal conductivities", Wikipedia, Internet Citation, XP-002664117, Oct. 18, 2011, Retrieved from the Internet: URL:https://en.wikipedia.org/w/index.php?title=List_of_ thermal_conductivities&oldid=456202311, 9 pages.

T. Shinohara, et al., "Report of new generation power electronics project", Kanagawa Academy of Science and Technology 2011, Jul. 7, 2010, 28 pages.

Extended European Search Report dated Jan. 8, 2016 in Patent Application No. 14178910.7.

Ursula R. Kattner "Phase Diagrams for Lead-Free Solder Alloys" JOM, vol. 54, No. 12, XP009083958, Dec. 2002; pp. 45-51.

Sabine Anhöck, et al., "Investigations of Au/Sn alloys on different end-metallizations for high temperature applications" IEEE/CPMT Berlin International Electronics Manufacturing Technology Symposium, XP010309432, Apr. 1998, pp. 156-165.

G.P. Vassilev, et al., "Calorimetric and phase diagram studies of the Co—Sn system" Intermetallics, vol. 15, No. 9, 2007, pp. 1156-1162.

"Electrical Resistivity of Pure Metals" CRC Handbook of Chemistry and Physics, 89$^{th}$ Edition, XP002545308, 2009, 3 Pages.

"Thermal and Physical Properties of Pure Metals" CRC Handbook of Chemistry and Physics, 88$^{th}$ Edition, XP002468845, 2008, 2 Pages.

Office Action dated Oct. 26, 2016 in Chinese Patent Application No. 201410452753.6 (with English translation).

Office Action dated Jan. 31, 2017 in Japanese Patent Application No. 2013-187709.

Communication Pursuant to Article 94(3) EPC dated Jun. 13 2017 in European Patent Application No. 14 118 910.1.

Mertens, "3 Physical-chemical background of the NTV process," XP001526267; Progress Reports VDI, Row 21, Electrical Engineering Dip.,-Phys. Christian Mertens, Seesen, No. 365, 2004 (with English translation).

Office Action dated Mar. 13, 2018, in Japanese Patent Application No. 2017-081341 (with English translation).

* cited by examiner

METALLIC PARTICLE PASTE, CURED PRODUCT USING SAME, AND SEMICONDUCTOR DEVICE

CROSS-REFERENCE TO RELATED APPLICATIONS

This application is based upon and claims the benefit of priority from prior Japanese Patent Application No. 2013-187709, filed Sep. 10, 2013; the entire contents of which are incorporated herein by reference.

FIELD

Embodiments described herein generally relates to a metallic particle paste, a cured product using the same, and a semiconductor device.

BACKGROUND

Solder is used as a material to bond an electronic part to a substrate in an electronic device, and use of lead-free solder is proceeding. However, in the case of the solder to be used for a bonding portion of a power device that reaches a high temperature during use, it is difficult to achieve lead-free solder. In recent years, development of a wide band gap semiconductor operable at higher temperatures than Si has been undertaken. The operating temperature of such power device is predicted to reach about 300° C. Thus, superior heat resistance is required of a bonding material.

Currently, sinter-bonding metallic particles are candidate of the high thermostability bonding material, that is cured by heat or electromagnetic waves. For example, there is suggested a paste prepared by covering metallic nano particles having high activity with an organic compound that is easily degraded by heat. In addition, there is suggested a method of making a high-strength joint using metallic nano particles. Further, there is suggested a method of forming a fine wiring pattern on a substrate using metallic nano particles.

A bonding portion formed by using the conventional metallic particle paste and subjecting such to a heat treatment at about 200 to 350° C. is a cured product consisting of porous metal having fine voids. The cured product is in a state in which the sintering process is stopped in the middle of the process. Thus, when the product is left to stand at the curing temperature or in high-temperature environments, the diffusion of metal in the bonding portion is progressed. Accordingly, fine voids aggregate near the interface between the bonding portion and a chip or near the interface between the bonding portion and an electrode, resulting in deterioration of the structure. This has been reported until now.

If attention is paid to the fact that the deterioration mechanism in high-temperature environments is based on the diffusion of metal, an effective method generally includes dispersing a small amount of a second element in the grain boundary phase of the metal structure and stabilizing the structure by a pinning effect. In order exhibit the pinning effect, the type of the second element is not particularly limited. It is important to uniformly disperse the second element in the grain boundary phase. In order to obtain a structure in which the second element is uniformly dispersed in the grain boundary phase using the metallic particle paste, a method of mixing fine particles of the first metal as base particles with fine particles of the second metal has been reported.

However, fine particles usually aggregate to form a secondary particle. Accordingly, it is very difficult to obtain a metallic particle paste containing the fine particles of the first metal and the fine particles of the second metal mixed uniformly.

DETAILED DESCRIPTION

The metallic particle paste of the embodiment contains a polar solvent and particles dispersed in the polar solvent and containing a first metal. A second metal different from the first metal is dissolved in the polar solvent.

Hereinafter, embodiments of the present invention will be described with reference to the drawings.

Figure 1:
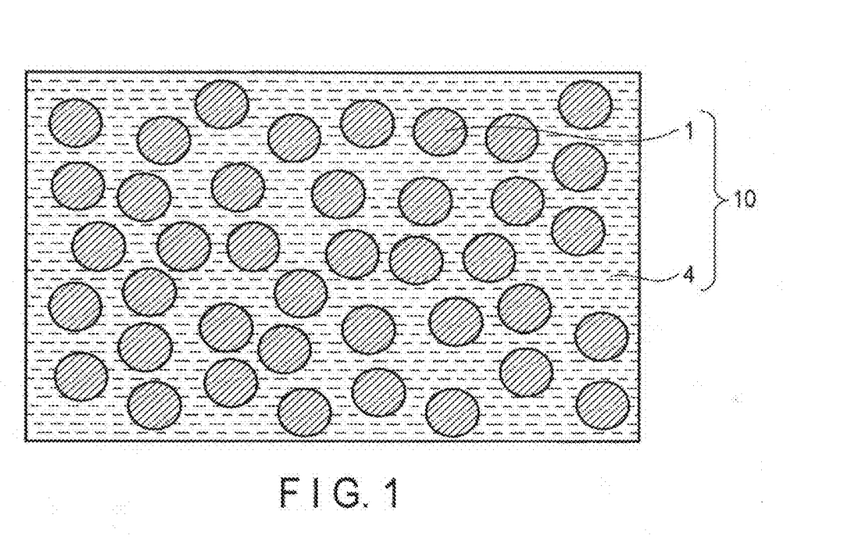
FIG. 1 is a conceptual diagram of a metallic particle paste according to one embodiment.

FIG. 1 is a conceptual diagram of a metallic particle paste according to one embodiment. A metallic particle paste 10 of one embodiment contains two different metals, such as first and second metals. In the metallic particle paste 10 of this embodiment, the first metal is dispersed in a polar solvent 4 as particles 1, while the second metal is dissolved in the polar solvent 4.

The metallic particle paste of this embodiment is cured into a cured product. The first metal forms a matrix that plays a role in electrical conductivity and thermal conductivity in this cured product. As already described, inhibiting the diffusion of the first metal forming the matrix of the cured product leads to suppression of the deterioration of this cured product. In order to inhibit the diffusion of the first metal, it is effective to allow the second metal different from the first metal to be uniformly present at the grain boundary of the first metal forming the matrix of the cured product. The second metal to be used in this embodiment has an effect of suppressing the diffusion of the first metal in the cured product, because it is different from the first metal.

Additionally, the second metal is not present as particles, but is dissolved in the polar solvent, and thus it is possible to allow the second metal to be uniformly present in the metallic particle paste of this embodiment. In the cured product obtained by curing the metallic particle paste of this embodiment, the first metal forms a matrix and the second metal is precipitated on the surfaces of the particles of the first metal during the curing process. The precipitated second metal comprises, for example, particles having a particle diameter of 100 nm or less. Since the second metal is uniformly present in the paste, the second metal is uniformly precipitated in the cured product. As described above, the second metal different from the first metal forming the matrix inhibits the diffusion of the first metal. If the second metal is uniformly present near the grain boundary of the first metal, the effect of inhibiting the diffusion of the first metal and reducing the aggregation of voids is further improved. This results in suppression of deterioration in high-temperature environments. Thus, a cured product having a stable structure can be obtained.

Figure 2:
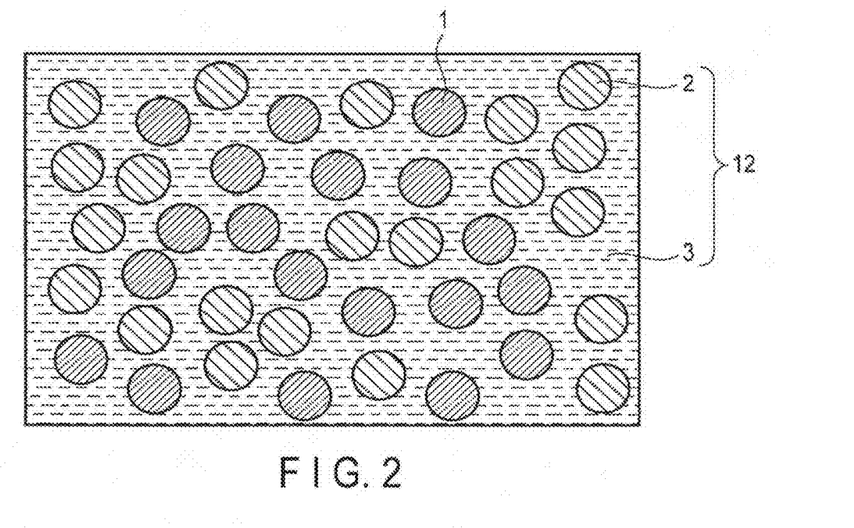
FIG. 2 is a conceptual diagram of the conventional metallic particle paste.

Note that, in the conventional metallic particle paste, particles 1 containing the first metal (first particles) and particles 2 containing the second metal (second particles) are dispersed in a solvent 3 as shown in FIG. 2. A conventional metallic particle paste 12 containing the first and second particles is accompanied by a problem of aggregation of the particles. Additionally, it is theoretically impossible to disperse into a size smaller than the particle size. Therefore, it has been difficult to uniformly mix the first particles with the second particles. As a result, a cured product having the second metal uniformly dispersed therein has not been sufficiently obtained by using the conventional metallic particle paste.

As described above, in the cured product obtained by using the metallic particle paste of this embodiment, the metal (the second metal) different from the metal forming the particles (the first metal) is dissolved in a solvent, the first metal forms a matrix and the second metal is uniformly present in the matrix. The diffusion of the first metal is inhibited by the second metal, and thus the aggregation of voids is reduced. This results in suppression of deterioration in high-temperature environments. Thus, a cured product having a stable structure can be obtained.

In the metallic particle paste of this embodiment, the first metal may be either a noble metal or a non-noble metal as long as the electrical conductivity and thermal conductivity can be provided. However, the first metal is not particularly limited thereto. Taking into consideration the electrical conductivity and the thermal conductivity, the first metal is preferably selected from the group consisting of Au, Pt, Pd, Ru, Rh, Ir, Ag, Cu, Ni, Zn, Bi, Fe, Mo, Al, Cr, and V. As long as the electrical conductivity and the thermal conductivity can be maintained, the first metal may be a compound such as a metal oxide or may be in the form of an alloy. When at least one selected from Ag, Cu, and Au is used as the first metal, the electrical conductivity and thermal conductivity of the cured product to be obtained can be further improved.

Although the particle diameter of the particles 1 containing the first metal is not particularly limited as long as it is in a range that can form a desired cured product, a smaller particle diameter is preferred. The smaller the particle diameter is, the more improved the activity is. Additionally, the contact area between the particles increases. As a result, the electrical conductivity and thermal conductivity of a cured product to be obtained are improved. When the metallic particle paste which contains the particles containing the first metal is used to bond the bonded members, the bonding strength is also increased.

The particle diameter of first metal particles may be set in, for example, the range of 1 to 10000 nm. Here, the particle diameter may be found by observation with a transmission electron microscope. The particle diameter of the particles containing the first metal is more preferably 5 to 5000 nm, still more preferably 10 to 1000 nm. The particle diameter of the particles containing the first metal is still more preferably 10 to 500 nm, most preferably 10 to 100 nm. The particles containing the first metal having a specific particle diameter may be used alone. Alternatively, a plurality of particles having different particle diameters may be used in combination with each other.

The content of the particles containing the first metal in the metallic particle paste is not particularly limited as long as it is in a range that can form a desired cured product. As the content of the particles containing the first metal is higher, the solid filling rate at an early stage of curing can be improved. Thus, in the metallic particle paste of the present embodiment, the content of the particles containing the first metal is preferably 30% by mass or more and less than 100% by mass (for example, less than 99% by mass). More preferably, the content of the particles containing the first metal is 50% by mass or more.

An organic compound having a hydrophilic group is attached or linked to the surfaces of the particles 1 containing the first metal. The organic compound is effective in protecting the surfaces of the particles and improving the dispersion stability of the particles in the polar solvent. Since the dispersion stability of metallic particles in the polar solvent is enhanced by the hydrophilic groups, the aggregation of particles can be reduced. Examples of the hydrophilic group include a hydroxyl group, an amino group, and an imino group.

The content of the organic compound in the metallic particle paste is not particularly limited. In order to increase the content of the metallic particles, the content of the organic compound is preferably as low as possible. For example, it is preferably 0.1 to 10% by mass. The content of the organic compound present on the particle surface may be confirmed by thermogravimetric analysis.

In this embodiment, the particles containing the first metal are mixed with the polar solvent in which the second metal is dissolved to prepare a paste for use so that the particles are smoothly supplied. The use of the polar solvent allows the second metal to be well dissolved. The polar solvent may be selected from, for example, the following groups.

(a) Alcohols (e.g., aliphatic alcohols (heptanol, octanol (1-octanol, 2-octanol, etc.), and decanol (1-decanol, etc), saturated or unsaturated aliphatic alcohols such as lauryl alcohol, tetradecyl alcohol, cetyl alcohol, octadecyl alcohol, hexadecenol, and oleyl alcohol, alicyclic alcohols (e.g., cyclo alkanols such as cyclohexanol; terpene alcohols such as terpineol and dihydroterpineol (e.g., monoterpene alcohol)), aromatic aliphatic alcohols (e.g., benzyl alcohol and phenethyl alcohol), polyhydric alcohols (ethylene glycol, propylene glycol, diethylene glycol, dipropylene glycol, etc.);

(b) glycol ethers (e.g., (poly)alkylene glycol monoalkyl ethers such as ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol monobutyl ether, propylene glycol monomethyl ether, dipropylene glycol monomethyl ether, and tripropylene glycol butyl ether; and (poly)alkylene glycol monoaryl ethers such as 2-phenoxyethanol);

(c) glycol esters (e.g., (poly)alkylene glycol acetate such as carbitol acetate);

(d) glycol ether esters (e.g., (poly)alkylene glycol monoalkyl ether acetate such as ethylene glycol monoethyl ether acetate, ethylene glycol monomethyl ether acetate, diethylene glycol monobutyl ether acetate, diethylene glycol monoethyl ether acetate, and propylene glycol monomethyl ether acetate);

(e) esters (e.g., benzyl acetate, isoborneol acetate, methyl benzoate, and ethyl benzoate);

(f) amino compounds (monoethanolamine, diethanolamine, triethanolamine, N-methyldiethanolamine, N-ethyldiethanolamine, etc.);

(g) aliphatic hydrocarbons other than those described above (e.g., saturated or unsaturated aliphatic hydrocarbons such as tetradecane, octadecane, heptamethylnonane, tetramethyl pentadecane); and (h) aromatic hydrocarbons other than those described above (e.g., toluene and xylene).

Further, water may also be used as the polar solvent. These polar solvents may be used in combination with two or more thereof as long as they are uniformly mixed without being isolated.

The metallic particle paste of this embodiment contains the first metal to be dispersed as particles and the second metal different from the first metal. Since the matrix of the cured product obtained by curing the metallic particle paste of this embodiment is formed of the first metal, the amount of the second metal in the metallic particle paste is smaller than that of the first metal. When the amount of the second metal present in the paste is 0.001 atomic % or more with respect to the first metal, the effect of inhibiting the diffusion of the first metal in the cured product can be exerted. Since the amount of the second metal is smaller than that of the first metal, even when the metal without sufficiently high electrical conductivity and thermal conductivity is used as the second metal, the characteristics of the cured product are not largely impaired.

Note that the amount (atomic %) of the second metal to the first metal can be generally calculated based on the kind and content of each metal.

As described above, the first metal forms a matrix in the cured product, and thus the content of the first metal in the metallic particle paste is larger than that of the second metal. Since the first metal forms a matrix in the cured product, the electrical conductivity and thermal conductivity of the first metal are preferably superior to those of the second metal.

As the second metal, for example, a metal different from the first metal may be selected from alkaline earth metals, Au, Pt, Pd, Ag, Cu, Cr, Ni, Nb, Mo, Sn, Bi, In, Sb, Ge, Co, Zn, Ti, Al, V, Y, Zr, Hf, Be, Mg, Mn, Fe, Zr, and W and used.

When an oxidizable non-noble metal is used as the second metal, the second metal is oxidized during the curing process, the melting point is increased, and the stability is improved. In the cured product, the oxidized second metal is stably present in the matrix of the first metal. As a result, it is possible to suppress the diffusion of the first metal under higher temperature conditions. Further, when the second metal forms an oxide, the hardness also becomes higher. Accordingly, mechanical characteristics such as strength can be further improved. Among the metals previously listed, alkaline earth metals, Cu, Cr, Ni, Nb, Mo, Sn, Bi, In, Sb, Ge, Co, Zn, Ti, Al, V, Y, Zr, Hf, Be, Mg, Mn, Fe, Zr, and W correspond to oxidizable non-noble metals.

With reference to the case where the second metal is a non-oxidizable metal, the use of the metal which forms an intermetallic compound with the first metal as the second metal allows the diffusion of the first metal to be suppressed. If the intermetallic compound is formed in the cured product, the melting point is increased, and the stability is improved. The formed intermetallic compound is stably present in the matrix of the cured product formed of the first metal. The diffusion of the first metal can be suppressed even under higher temperature conditions. Further, when the first metal and the second metal are used to form an intermetallic compound, the hardness also becomes higher. Accordingly, mechanical characteristics such as strength can be further improved. For example, the combination includes a combination of at least one selected from Ag, Cu, Ni, Au, and Pd with Sn.

The content of the second metal is not particularly limited as long as the metal is soluble in a polar solvent and a desired cured product can be formed. Even if the amount of the second metal in the metallic particle paste is slightly excessive with respect to the solubility, the effect of suppressing the diffusion of the first metal in the cured product is confirmed. If the amount of the second metal is smaller, the metal is easily dissolved in the polar solvent, and the strength, electrical conductivity, and thermal conductivity of the cured product are less influenced.

When the content of the second metal is excessively high, the concentration exceeds the solubility in the polar solvent, resulting in undissolved residues. If undissolved residues of the second metal occur in the metallic particle paste, it is not possible to uniformly disperse the second metal at the grain boundary of the first metal in the cured product. It is found that defects such as coarse particles and coarse voids occur in the cured product in the worst case. The coarse particles are formed by the aggregation and precipitation of the second metal. The coarse voids are formed by the gasification of organic components contained in the raw material of the second metal (a complex, an organometallic compound or a salt) during the curing process.

The presence of coarse particles and coarse voids may cause a decrease in the strength, thermal conductivity, and electrical conductivity of the cured product. Therefore, the amount of the second metal in the metallic particle paste is preferably not more than the solubility in order to completely dissolve the metal in the polar solvent. Note that the solubility of the second metal in the polar solvent may be obtained from physical properties in the references or the like.

In order to sufficiently obtain a target effect with minimal impairment of the strength, thermal conductivity, and electrical conductivity of the cured product, the amount of the second metal is 0.001 atomic % or more with respect to the first metal and not more than the solubility to the polar solvent.

The metallic particle paste of this embodiment may be prepared by for example, mixing particles containing the first metal, a raw material of the second metal, and a polar solvent. As described above, examples of the raw material of the second metal include complexes, organometallic compounds, and salts containing the second metal. When a complex is used as the raw material of the second metal, the second metal is present in the form of a complex ion in the metallic particle paste. When an organometallic compound or a salt is used as the raw material of the second metal, the second metal is present in the form of an organometallic ion or in the form of an ion of a metal in the metallic particle paste.

The thermal decomposition temperature of the raw material of the second metal is preferably 400° C. (i.e., the upper limit of the curing temperature) or less. Although it is not particularly limited, metal carboxylic salts are preferred as the raw material of the second metal since the solubility in the polar solvent is superior. For example, carboxylic salts of Ni are preferred.

In the mixing process, the particles containing the first metal are first dispersed in the polar solvent, and the raw material of the second metal is added to the resulting dispersion. Alternatively, the metallic particle paste according to this embodiment may be prepared by dissolving the raw material of the second metal in the polar solvent and dispersing the particles containing the first metal in the resulting solution.

The metallic particle paste of this embodiment may be prepared by mixing a paste obtained by dispersing the particles containing the first metal in a polar solvent with the raw material of the second metal. For example, a paste obtained by dispersing Ag nanoparticles as the particles containing the first metal in terpineol as the polar solvent is known as a metallic nano particle paste for forming a wire or use in the bonding process.

The metallic particle paste of this embodiment may be used to bond the members to be bonded for the semiconductor device.

The material of the member to be bonded is not particularly limited, and a metal material, a plastic material, a ceramic material or the like may be used. The metal material may be selected from, for example, Au, Ag, Cu, Al, Fe, and stainless steel. The plastic material may be selected from, for example, polyimide, polyethylene, polypropylene, polyethylene terephthalate, polybutylene terephthalate, polycarbonate, polyethylenenaphthalate, polyvinyl butyral, nylon, and epoxy. The ceramic material may be selected from, for example, glass, alumina, aluminium nitride, silicon nitride, gallium nitride, gallium oxide, magnesium oxide, silicon carbide, boron nitride, mullite, diamond, and beryllia.

A thin film containing at least one selected from the group consisting of Au, Pt, Pd, Ag, Cu, Sn, and Ni may be provided on the surface of the member formed of the above materials.

Further, semiconductor elements may be used as the members to be bonded. Particularly, when a high heat resistant metal such as Au, Pt, Pd, Ag, Cu or Ni is used as the first metal, not only silicon but also a power device element such as silicon carbide, gallium nitride, gallium oxide or diamond may be used for the members to be bonded. The use of the power device element in the bonding process results in a reduction in impact of heat. Thus, the structure of a cooling device can be simplified. As a result, it is possible to achieve a size reduction of the device and an improvement in the degree of freedom of design.

When applied to the semiconductor element, a thin film containing at least one selected from the group consisting of Au, Pt, Pd, Ag, Cu, Sn, and Ni may be similarly provided on the surface of the member.

Figure 3:
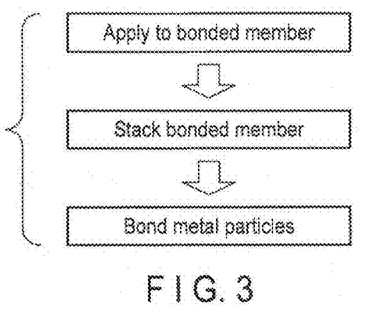
FIG. 3 is a flow chart of a bonding method using the metallic particle paste.

In the bonding process, as shown in the flow chart of FIG. 3, the metallic particle paste is first applied to one of the members to be bonded to form a paste layer. The other member to be bonded is stacked thereon. The metallic particle paste may be applied by printing or coating. Next, the metal particles are bonded so that the two members to be bonded are bonded through a bonding layer consisting of a cured product.

The metal particles may be bonded by, for example, heating and pressurization. Although the heating temperature is not particularly limited, it is preferably set to a temperature lower than the temperature which can be endured by an organic insulating film on the chip when the power device element is bonded. In general, if the temperature is 400° C. or less, the possibility of impairing the thermal stability of the organic insulating film is low. Note that the metal particles can be bonded by utilizing ultrasonic impacts, electromagnetic wave impacts, or chemical reactions even if the heating process is not performed.

The contact points of the metal particles are increased by applying pressure, which facilitates the bonding process. The pressure is preferably 5 MPa or more; however, it is not limited thereto. The metal particles may be bonded by utilizing ultrasonic waves, electromagnetic waves, or chemical reactions without applying any pressure.

In some cases, the bonding of the metal particles may be inhibited depending on the polar solvent in the metallic particle paste. Such a problem can be avoided by removing the solvent before the process of bonding the metal particles by sintering after applying the paste. Specifically, a dry product is previously produced by drying the metallic particle paste of this embodiment. The dry product may be produced on a separable support sheet. In the present specification, a state in which the polar solvent in the metallic particle paste is substantially removed is referred to as "dry".

For example, the metallic particle paste is formed into a size and shape suitable for the bonding portion. The formed product is left to stand and the polar solvent is removed therefrom, to obtain a dry product. It may be left to stand at normal temperature. When it is heated at a low temperature, the time required to remove the polar solvent can be reduced. An electronic part is disposed on a substrate through the resulting dry product and heated at a predetermined temperature so that the electronic part can be bonded to the substrate. The dry product produced on the separable support sheet is transferred to a predetermined region of the substrate so that a wire can be formed.

When producing a dry product, a binder or a plasticizer may be added to the metallic particle paste. In this case, the moldability and plasticity of the dry product can be improved.

As the binder, a resin selected from the following groups may be used. That is, polyester resins, various modified polyester resins (e.g., urethane-modified, epoxy-modified, and acryl-modified polyester resins), polyether urethane resins, polycarbonate urethane resins, acryl urethane resins, polyvinyl chloride acetate copolymers, epoxy resins, phenol resins, phenoxy resins, acrylic resins, polyvinyl butyral resins, polyamidoimide, polyimide, polyamide, modified celluloses (e.g., nitrocellulose, cellulose acetate butylate (CAB) and cellulose acetate propionate (CAP)); vinyl-based resins (e.g., vinyl acetate and polyvinylidene fluoride); cellulose-based resins (e.g., ethyl cellulose and nitrocellulose); and paraffin may be used.

The above binders may be used alone, or two or more thereof may be mixed for use as long as they are not isolated.

The plasticizer may be selected from the group consisting of, for example, dicarboxylic ester, phosphoric ester, polyester, epoxidized vegetable oil, polyether polyol, phthalic ester, dibutyl phthalate, dioctyl phthalate, polyethylene glycol, and glycerin. The plasticizers may also be used alone, or two or more thereof may be mixed for use as long as they are not isolated.

The total amount of the binder, the plasticizer, and other organic compounds is preferably in the range of 0.1 to 10% by mass.

The particles containing the first metal are used as domains (primary particles) to form an aggregate in the dry product. Particles having a particle diameter of about 100 nm or less, formed by the precipitation of the second metal, are uniformly formed on the surface of the aggregate. The state of the dry product can be observed with an electron microscope.

In the bonding layer to be obtained by using the metallic particle paste of this embodiment, the precipitation of the second metal in the structure causes the inhibition of the diffusion of the first metal. Thus, the aggregation of the voids is suppressed, and the bonding layer to be obtained has superior thermal stability. The second metal in the bonding layer does not always form particles. If the second metal is precipitated in the structure, a desired effect can be exerted.

The distribution state of the second metal in the structure of the bonding layer is not particularly limited. In this embodiment, the second metal is uniformly dispersed near the grain boundary of the first metal forming the matrix of the cured product to suppress the diffusion of the first metal.

As a result, a stable structure is obtained. The second metal is preferably present at the grain boundary or near the grain boundary of the structure of the cured product containing the first metal. The term "near the grain boundary" is not particularly limited, and the area is preferably one-tenth or less of the particle diameter of particles adjacent to an arbitrary grain boundary as a base. When the second metal is present in this range, the effect of suppressing the diffusion of the first metal is sufficiently exerted. Therefore, this embodiment is effective in suppressing the diffusion of the first metal.

The distribution state of the second metal is not limited thereto. The second metal may be present in an area outside the area which is one-tenth or less of the particle diameter of particles adjacent to an arbitrary grain boundary as a base. Further, the second metal in the structure of the bonding layer may be in the form of a compound such as a metal oxide or in the form of an alloy as long as the electrical conductivity and thermal conductivity of the bonding layer are maintained.

The metallic particle paste of this embodiment may be used to form a wire and a heat-radiation portion on an electronic substrate. In the metallic particle paste of this embodiment, the second metal is dissolved in the polar solvent, and the second metal is precipitated in the wiring structure when forming a wire consisting of the cured product. In the wire to be obtained, the diffusion of the first metal is prevented and the aggregation of voids is reduced. Thus, the wire has superior thermal stability.

Further, when the metallic particle paste according to this embodiment is used to form an electrode, it is possible to obtain an electrode having superior thermal stability.

Since the metallic particle paste according to this embodiment contains the particles containing the first metal and a polar solvent in which a second metal different from the first metal is dissolved and the particles containing the first metal is dispersed, it is possible to form a cured product which is less deteriorated in high-temperature environments.

Examples

Hereinafter, specific examples of the metallic particle paste will be described.

1. Preparation of Metallic Particle Paste

A metallic particle paste was prepared by using Ag as the first metal and Ni as the second metal. As the first metal particles, Ag particles having a particle diameter of about 20 nm are contained. The Ag particles are dispersed in terpineol as a polar solvent. The amount of the Ag particles in the paste is about 80% by mass.

Ni as the second metal was used as carboxylic salts. Carboxylic salt of Ni was added to the Ag nanoparticle paste so that the amount of the second metal (Ni) was a predetermined value, and a plurality of metallic particle pastes was prepared. The amount of the second metal (Ni) is shown in Table 1.

TABLE 1

| Sample No. | Ni amount in Ag [atomic %] |
|---|---|
| 1 | 0 |
| 2 | 0.0002 |
| 3 | 0.001 |
| 4 | 0.002 |
| 5 | 0.02 |
| 6 | 0.04 |

TABLE 1-continued

| Sample No. | Ni amount in Ag [atomic %] |
|---|---|
| 7 | 0.2 |
| 8 | 0.3 |
| 9 | 3 |

Undissolved residues of carboxylic salts of Ni were confirmed in the metallic particle pastes of Sample Nos. 7 to 9. Thus, an amount of 0.2 atomic % or more indicates that the concentration exceeded the solubility and an excessive amount of the carboxylic salts of Ni was added.

Each of the resulting metallic particle pastes was applied onto each substrate, followed by heating at 100° C. for 30 minutes, to evaporate the polar solvent, and thus dry products were produced. The resulting dry products were observed with an electron microscope. As a result, in the dry products of Sample Nos. 2 to 9 which contained the carboxylic salts of Ni, it was confirmed that particles having a particle diameter of about 5 to 20 nm were dispersed. These particles were formed by the precipitation of carboxylic salts of Ni.

Figure 4:
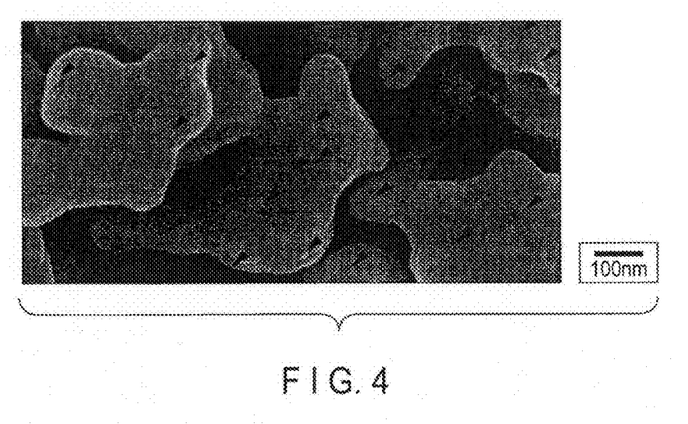
FIG. 4 is an electron micrograph of a dry product of the metallic particle paste in the Examples.

As an example, an electron micrograph of the dry product of Sample No. 9 is shown in FIG. 4. FIG. 4 shows an aggregate of the particles containing the first metal. It is found that the aggregate is formed by using the particles having a particle diameter of 500 nm or less as domains (primary particles). Further, fine particles of carboxylic salts of Ni precipitated are indicated with black triangle markers.

Figure 5:
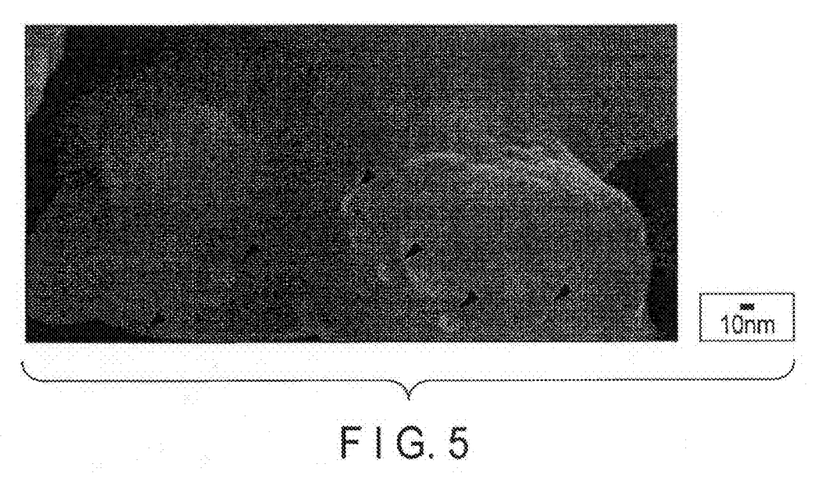
FIG. 5 is a highly magnified electron micrograph of the dry product of the metallic particle paste in the Examples.

FIG. 5 is a highly magnified electron micrograph. The precipitated fine particles of carboxylic salts of Ni are clearly observed on the surface of the aggregate. The particle diameter of the particles is 100 nm or less.

Figure 6:
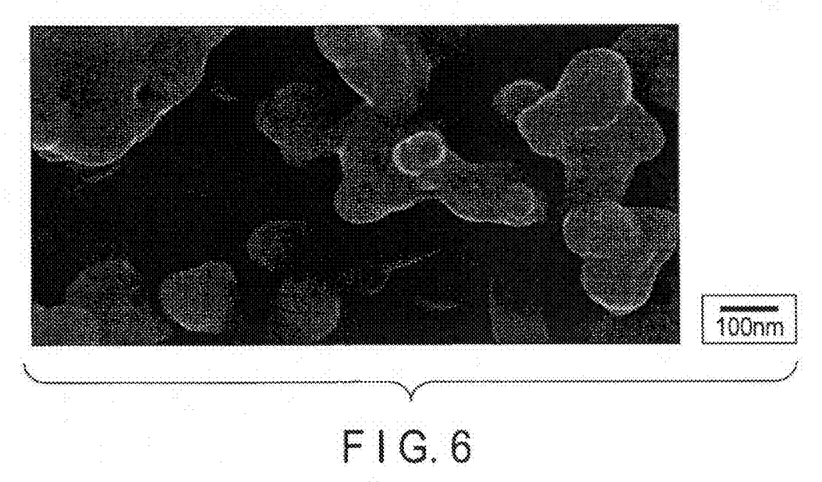
FIG. 6 is an electron micrograph of a dry product of the metallic particle paste in the Comparative examples.

FIG. 6 shows an electron micrograph of the dry product of Sample No. 1. The magnification is the same as that of FIG. 4. It is found that when the carboxylic salts of Ni are not contained, fine particles of carboxylic salts of Ni are not produced.

2. Die Shear Test

The metallic particle pastes described in Table 1 were used to produce test pieces, and the die shear test was performed on those pieces. First, a Cu-clad ceramic substrate was prepared and subjected to a pretreatment including: ultrasonic cleaning in acetone; and acid pickling in hydrochloric acid. Note that the Cu film is used as an electrode. Subsequently, the substrate was washed with water and dried to remove the oxide film on the Cu electrode. A 4 mm□-pattern of the metallic particle paste was printed on the Cu electrode using a 0.05 mm-thick metal stencil.

The pattern of the metallic particle paste was dried at 100° C. for 30 minutes. Then, an SiC chip having a size of 3 mm□ was disposed on the center of the printed pattern. An Au electrode is provided on the outermost surface of the back side of the used SiC chip. The chip was bonded to the substrate by heat-pressurizing at 300° C./5 MPa in a nitrogen atmosphere for 5 minutes using a die bonder to produce a test piece.

Figure 7:
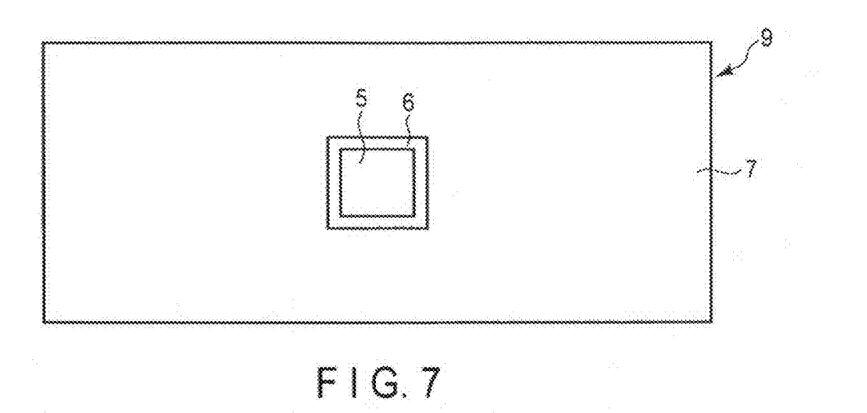
FIG. 7 is a top view showing an outline of a test piece.
Figure 8:
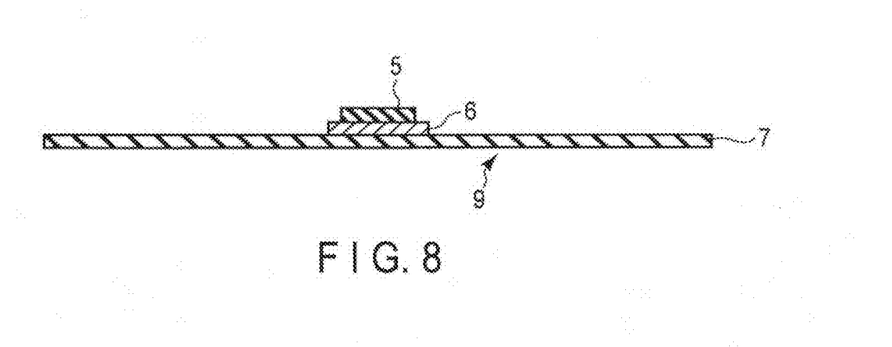
FIG. 8 is a side view showing the outline of the test piece.

The top and side views of the resulting test piece are shown in FIGS. 7 and 8. As illustrated, in a test piece 9, an SiC chip 5 is disposed on a Cu-clad ceramic substrate 7 through a bonding layer 6.

Figure 9:
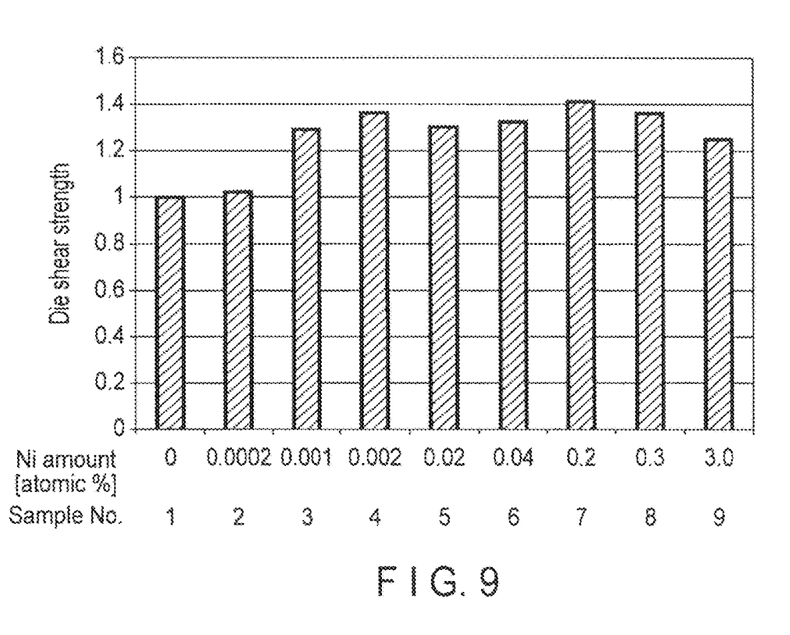
FIG. 9 is a diagram showing the die shear strength.

The bonding strength of each of the test pieces was measured by the die shear test (test rate: 0.2 mm/sec). The resulting values were normalized by the value of Sample No.

1 not containing carboxylic salts of Ni, and shown in FIG. 9. From FIG. 9, it is found that the strength of Sample Nos. 3 to 9 containing 0.001 atomic % or more of the second metal (Ni) in the bonding layer is higher than that of Sample Nos. 1 and 2.

3. High-Temperature Shelf Test

A Cu-clad ceramic substrate after being subjected to the same treatment as described above to remove an oxide film of the surface of the Cu electrode was prepared. An 8 mm□ pattern of the metallic particle paste was printed on the Cu-clad ceramic substrate using the same metal stencil as described above. The paste was dried at 100° C. for 30 minutes. Then, an SiC chip having a size of 7 mm□ was disposed on the center of the printed pattern. An Au electrode is provided on the outermost surface of the back side of the used SiC chip. The chip was bonded to the substrate by heat-pressurizing at 300° C./5 MPa in a nitrogen atmosphere for 5 minutes using a die bonder to produce a test piece.

It is reported that, in the bonding layer containing the metal particles, fine voids are aggregated from the center of the bonding layer toward the chip or the substrate electrode and the maldistribution of the voids results in deterioration. In order to quantify the deterioration of the bonding layer, the cross-sectional structure of the bonding layer was observed. Before and after the high-temperature shelf test, the cross-sectional structure after the polish-processing was observed with an electron microscope.

Figure 10:
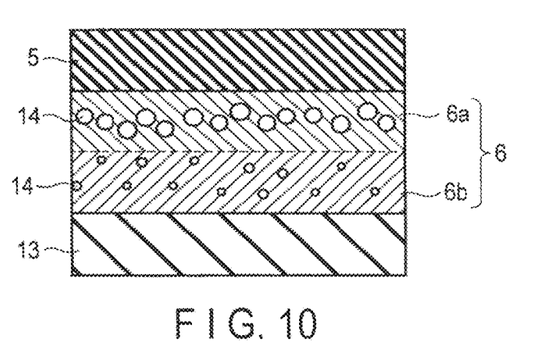
FIG. 10 is an explanatory view of a method of calculating the void area ratio.

The procedure of calculating the maldistribution of the voids will be described with reference to FIG. 10. FIG. 10 shows a schematic view of the bonding layer 6 between a Cu electrode 13 on the Cu-clad ceramic substrate and the SiC chip 5. As illustrated, the bonding layer 6 was divided in the middle into an upper layer 6a at the side of the SiC chip 5 and a lower layer 6b at the side of the Cu electrode 13. The area percentage of fine voids contained in the structures is determined. The void area percentage (%) is defined as follows.

(Void area percentage)=(void area)/((void area)+(metal area))×100

The photograph of the cross-sectional structure was biarized by using commercially available image-processing software. Thereafter, the void area and the metal area in the cross-sectional structure were calculated from the pixels.

The void area percentage of the upper layer 6a and the lower layer 6b are defined as $S_{6a}$ and $S_{6b}$, respectively. The void area ratio is calculated as follows.

(Void area ratio)=$S_{6b}/S_{6a}$

As the void area ratio approached 1, the voids present in the bonding layer 6 had no maldistribution. Before the high-temperature shelf test (early stage), the void area ratio in each case of the test pieces obtained by using the metallic particle pastes was 1.

Subsequently, each test piece was placed in an oven heated at 300° C. and subjected to the high-temperature shelf test for 100 hours. The cross section of each test piece after the test was subjected to polish processing. The cross section was observed with an electron microscope, and the void area ratio was determined by the above procedure.

Regarding each of the test pieces, the void area ratio after the high-temperature shelf test and the void area ratio before the test (early stage) are summarized in Table 2.

TABLE 2

| Sample No. | Void area ratio | |
|---|---|---|
| | Early stage | After test |
| 1 | 1 | 0.5 |
| 2 | 1 | 0.5 |
| 3 | 1 | 0.7 |
| 4 | 1 | 0.8 |
| 5 | 1 | 0.8 |
| 6 | 1 | 0.7 |
| 7 | 1 | 0.8 |
| 8 | 1 | 0.7 |
| 9 | 1 | 0.7 |

As shown in Table 2, in any of the test pieces before the high-temperature shelf test (early stage), the ratio of the void area at the side of the tip to the void area at the side of the electrode is approximately 1. Regardless of the concentration of Ni as the second metal, no maldistribution of the voids occurs in the bonding layer.

However, after the high-temperature shelf test, the void area ratio of Sample Nos. 1 and 2 is decreased to 0.5. It is found that when the metallic particle paste not containing the second metal (Sample No. 1) and the metallic particle paste containing the second metal in an amount of 0.0002 atomic % (Sample No. 2) were used, the amount of the voids present at the side of the SiC chip 5 of the bonding layer obtained was twice as much as the amount of the voids present at the side of the Cu electrode 13. If a large maldistribution of the voids occurs, in the amount of the voids, the deterioration becomes significant.

On the other hand, in Sample Nos. 3 to 9, the void area ratio after the high-temperature shelf test is 0.7 to 0.8, which is larger than the above value of 0.5. It is found that the maldistribution of the voids in these samples is smaller than that in Sample Nos. 1 and 2. The Ni amount in Sample Nos. 3 to 9 is 0.001 atomic % or more. If the void area ratio is 0.7 or more, a possibility of causing deterioration is small even when the maldistribution of the voids occurs. Thus, it is clear that the deterioration can be suppressed by this embodiment.

One embodiment has been described taking the example of the metallic particle paste containing Ag as the first metal and Ni the second metal, however it is not limited thereto. The use of the metallic particle paste according to the embodiment, which is obtained by dispersing particles containing the first metal in a polar solvent and dissolving a second metal different from the first metal in the polar solvent yields the same effects as described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A metallic particle paste comprising:
a polar solvent;
particles containing a first metal and dispersed in the polar solvent; and
a second metal different from the first metal and being dissolved in the polar solvent, wherein the first metal is Ag and the second metal is Ni, the polar solvent is selected from the group consisting of alcohols, glycol ethers, esters, amino compounds, aliphatic hydrocarbons, and aromatic hydrocarbons, and Ni is derived from a carboxylic salt of Ni, and wherein an amount of the second metal is 0.001 to 3 atomic % with respect to the first metal.

2. The metallic panicle paste according to claim 1, wherein each of the particles containing the first metal has a particle diameter of 1 to 10000 nm.

3. The metallic panicle paste according to claim 1, wherein the particles containing the first metal account for 30% by mass or more and less than 100% by mass of the metallic particle paste.

4. The metallic particle paste according to claim 1, wherein the second metal forms an intermetallic compound with the first metal.

5. The metallic particle paste according to claim 1, wherein the amount of the second metal is not more than a solubility in the polar solvent.

6. The metallic particle paste according to claim 1, wherein the amount of the second metal is 0.2 to 3 atomic % with respect to the first metal.

7. A cured product obtained by curing the metallic particle paste according to claim 1, wherein the second metal is present at a grain boundary or near the grain boundary of the particles containing the first metal.

8. A semiconductor device comprising:
a substrate having a wire; and
an electronic part and/or an electrode formed on the substrate through a bonding portion, at least one of the wire, the bonding portion, and the electrode comprising the cured product according to claim 7.

9. A dry product obtained by drying the metallic particle paste according to claim 1, comprising particles formed of a precipitation of the second metal.

10. The dry product according to claim 9, wherein the particles containing the first metal form an aggregate, a particle diameter of each of the particles is 500 nm or less, and a particle diameter of the particles formed of the precipitation of the second metal is 100 nm or less.

11. The dry product according to claim 9, further comprising a binder.

12. A cured product obtained by curing the dry product according to claim 9, wherein the second metal is present at a grain boundary or near the grain boundary of the particles containing the first metal.

13. A semiconductor device comprising:
a substrate having a wire; and
an electronic part and/or an electrode formed on the substrate through a bonding portion, at least one of the wire, the bonding portion, and the electrode comprising the cured product according to claim 12.

* * * * *